US008461545B2

(12) United States Patent
Imai

(10) Patent No.: US 8,461,545 B2
(45) Date of Patent: Jun. 11, 2013

(54) RADIOGRAPHIC IMAGING DEVICE AND RADIOGRAPHIC IMAGING SYSTEM USING THE SAME

(75) Inventor: Shinji Imai, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 177 days.

(21) Appl. No.: 12/913,404

(22) Filed: Oct. 27, 2010

(65) Prior Publication Data

US 2011/0095195 A1    Apr. 28, 2011

(30) Foreign Application Priority Data

Oct. 28, 2009    (JP) ................................ 2009-247736

(51) Int. Cl.
*G01T 1/20*    (2006.01)
(52) U.S. Cl.
USPC .................................... 250/370.11
(58) Field of Classification Search
USPC .................................... 250/370.11
See application file for complete search history.

(56) References Cited

U.S. PATENT DOCUMENTS

| 5,751,783 A | 5/1998 | Granfors et al. |
| 6,151,382 A | 11/2000 | Gilblom |
| 6,310,358 B1 * | 10/2001 | Zur ................. 250/591 |
| 7,006,598 B2 * | 2/2006 | Morii et al. ........ 378/97 |
| 2003/0030003 A1 * | 2/2003 | Maekawa et al. ........ 250/367 |
| 2004/0063819 A1 * | 4/2004 | Rao et al. ................ 524/22 |
| 2007/0187610 A1 | 8/2007 | Morii et al. |
| 2009/0026379 A1 | 1/2009 | Yaegashi et al. |
| 2009/0084960 A1 * | 4/2009 | Green ................. 250/361 R |

FOREIGN PATENT DOCUMENTS

| JP | 10-284289 A | 10/1998 |
| JP | 11-513122 A | 11/1999 |
| JP | 2004-97465 A | 4/2004 |
| JP | 2009-32854 A | 2/2009 |

OTHER PUBLICATIONS

Extended European Search Report mailed Dec. 12, 2012.

* cited by examiner

*Primary Examiner* — David Porta
*Assistant Examiner* — Hugh H Maupin
(74) *Attorney, Agent, or Firm* — Birch, Stewart, Kolasch & Birch, LLP

(57) ABSTRACT

This invention provides a radiographic imaging device, having: a scintillator layer which converts transmitted radiation incident with emission of radiation to an imaging target to light; a first organic photoelectric conversion layer which is continuous and converts a first light containing the maximum peak wavelength from the scintillator layer to a charge; an insulating substrate having a storage capacitor and a thin film transistor for reading the charge generating in the first organic photoelectric conversion layer for each image detection pixel; a second organic photoelectric conversion layer which converts a second light from the scintillator layer to a charge; and a radiation dose detection circuit for reading the charge generating in the second organic photoelectric conversion layer for each radiation dose detection pixel and a radiographic imaging system using the same.

14 Claims, 5 Drawing Sheets

RADIOGRAPHIC IMAGING DEVICE AND RADIOGRAPHIC IMAGING SYSTEM USING THE SAME

CROSS-REFERENCE TO RELATED APPLICATION

This application claims priority under 35 USC 119 from Japanese Patent Application No. 2009-247736, filed on Oct. 28, 2009, the disclosure of which is incorporated by reference herein.

BACKGROUND OF THE INVENTION

1. Field of the Invention

The present invention relates to a radiographic imaging device and a radiographic imaging system using the same.

2. Description of the Related Art

In the medical field, a radiographic imaging device which images the inside of a human body by irradiating the human body with radiation, such as X-rays and detecting the intensity of the radiation transmitted into the human body is used. Examples of such a radiographic imaging device include a system including first directing incident light from radiation transmitted into a human body to a phosphor body, converting the same to visible light, converting the visible light to an electrical signal, and then extracting the same to an exterior location.

As such a radiographic imaging device, a radiographic imaging device having a scintilator layer containing a phosphor sensitive to radiation, an upper electrode and a lower electrode, an organic photoelectric conversion layer disposed between the upper electrode and the lower electrode and absorbing light emitted by the radiation incident on the scintilator layer and converting the same to a charge, and an insulating substrate having a storage capacitor and thin film transistor unit for reading the charge generated in the organic photoelectric conversion layer for each image detection pixel, is known (Japanese Patent Application Laid-Open (JP-A) No. 2009-32854).

It is no exaggeration to say that the diagnosis target in a radiographic image can be any portion of a human body, such as the internal organs, bones, muscles, or blood vessels. In order to obtain favorable images in desired portions, the dose of radiation emitted needs to be adjusted to an accurate numerical value.

In general, imaging is carried out while making the dose of radiation smaller for portions containing much water, such as internal organs, and making the dose of radiation larger for bones. As the characteristics of an X-ray tube, which is one radiation source, in the case of the same tube voltage and the same irradiation time, the dose of X-rays becomes larger when the energy of the X-rays is higher. The imaging conditions need to be determined while considering the above so that images of desired portions have sufficient gradation.

In contrast, the dose of radiation, such as X-rays, to be emitted to a human body needs to be made as small as possible, and re-imaging particularly needs to be avoided.

As a radiographic imaging device which automatically controls the dose of radiation, a device having a photodiode containing amorphous silicon which absorbs light emitted by radiation incident on an scintilator layer and converting the same to a charge formed in pixel units and a light detector for receiving light passing through a region between the pixel units, in which the dose of radiation is detected by the light detector and controlled, is known (see, for example, Japanese National Phase Publication No. 11-513122 and JP-A No. 10-284289).

As another radiographic imaging device which automatically controls the dose of radiation, a device additionally having a monitoring thin film transistor for detecting a voltage value generated by charges accumulated in a storage capacitor for image detection, in which information on the dose of X-rays of each pixel is obtained by the monitoring thin film transistor, and the dose of X-rays is controlled based on the information, is known (see, for example, JP-A No. 2004-97465).

However, in the radiographic imaging devices disclosed in Japanese National Phase Publication No. 11-513122 and JP-A No. 10-284289, a photodiode containing amorphous silicon divided for each pixel unit needs to be formed. Furthermore, it is necessary to provide another photoelectric conversion layer for performing photoelectric conversion of the light passing through the region between the pixel units and the photoelectric conversion characteristics of the amorphous silicon and the photoelectric transfer characteristics of the another photoelectric conversion layer are difficult to make the same. Thus, the dose of X-rays is not always controlled accurately.

In the radiographic imaging device disclosed in JP-A No. 2004-97465, the monitoring thin film transistor needs to additionally be provided for each image detection pixel, which complicates the radiographic imaging device.

SUMMARY OF THE INVENTION

The present invention has been made in view of the above circumstances and provides a radiographic imaging system and a radiographic imaging device using the same.

A first aspect of the present invention provides:

a radiographic imaging device, comprising:

a scintilator layer which converts, to light, transmitted radiation that is incident with emission of the radiation to an imaging target;

a first organic photoelectric conversion layer which is continuous and converts a first light containing a maximum peak wavelength from the scintilator layer to a charge;

an insulating substrate having a storage capacitor and a thin film transistor for reading the charge generated in the first organic photoelectric conversion layer for each of a plurality of image detection pixels;

a second organic photoelectric conversion layer which converts a second light from the scintilator layer to a charge; and a radiation dose detection circuit for reading the charge generated in the second organic photoelectric conversion layer for each of a plurality of radiation dose detection pixels.

A second aspect of the present invention provides:

a radiographic imaging system, having:

a radiation emitting device;

the radiographic imaging device according to the first aspect of the present invention; and a control device which controls the radiation emitting device based on a dose of radiation detected in a radiation dose detection circuit of the radiographic imaging device.

DETAILED DESCRIPTION OF THE INVENTION

A radiographic imaging device according to the invention will be described with reference to the attached drawings.
<First Exemplary Embodiment>

Figure 1:
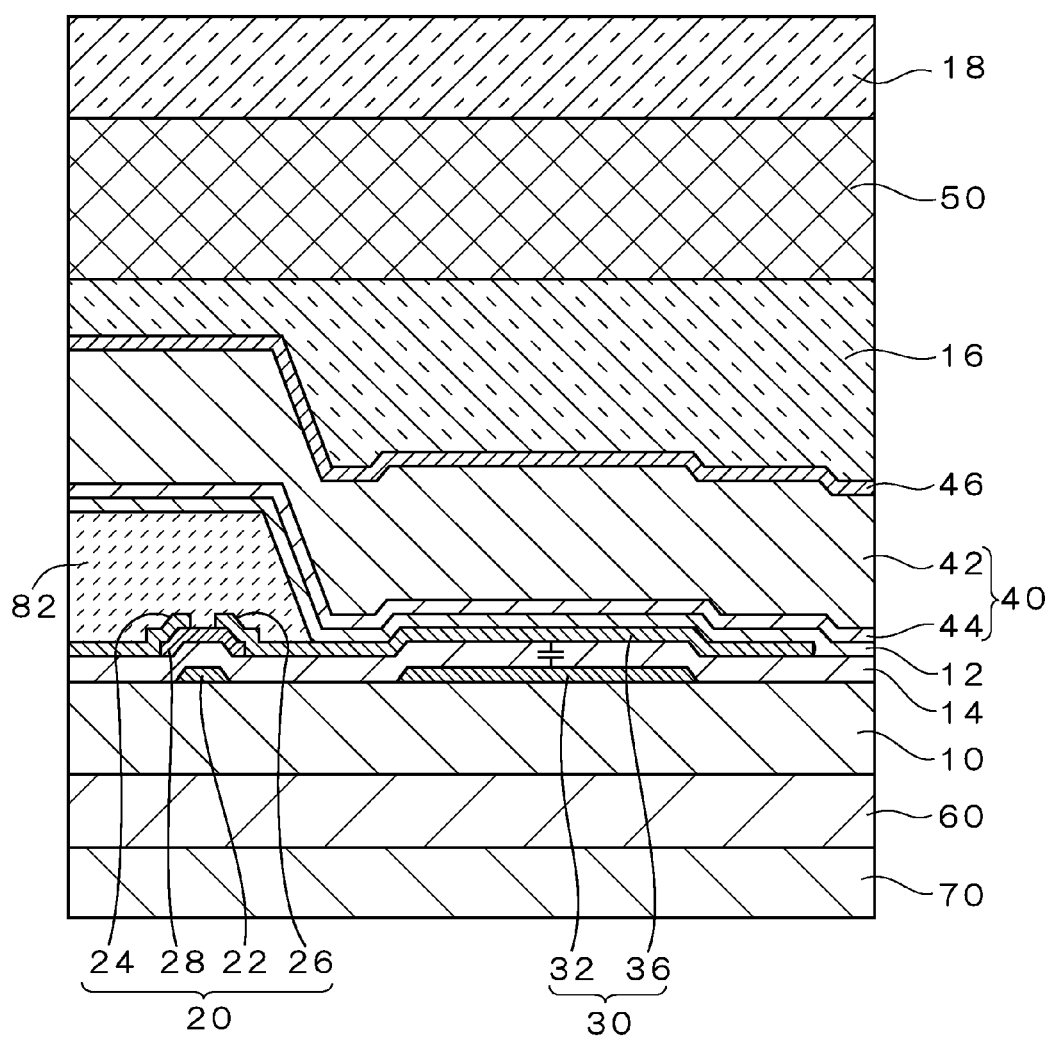
FIG. 1 is a cross sectional view illustrating an example of a configuration for one pixel according to a first exemplary embodiment of an imaging device according to the invention.

FIG. 1 is a cross sectional view schematically illustrating the configuration of one pixel of a radiographic imaging device according to a first exemplary embodiment of the radiographic imaging device according to the invention. In FIG. 1, a scintilator layer 50 which converts, to light, radiation transmitted into an imaging target with the emission of the radiation to the sample is provided on one surface of a plastic support 18 of polyethylene terephthalate or the like. On one surface of an insulating substrate 10, a storage capacitor 30 and a thin film transistor 20 are provided and a first organic photoelectric conversion layer 40 is further provided thereon. Then, the scintilator layer 50 and the first organic photoelectric conversion layer 40 are layered via a second interlayer insulating film 16 in such a manner as to face each other. Furthermore, at the other surface (hereinafter also referred to as a "back surface") of the insulating substrate 10, a second organic photoelectric conversion layer 60 and a radiation dose detection circuit 70 for reading a charge generated in the second organic photoelectric conversion layer 60 for each radiation dose detection pixel are provided.

The first organic photoelectric conversion layer 40 contains a charge transport layer 42 and a charge generating layer 44 and is layered via an undercoat layer 12 containing a silane coupling agent or the like in such a manner as to cover the storage capacitor 30 and the thin film transistor 20. Between the first organic photoelectric conversion layer 40 and the second interlayer insulating film 16, a bias electrode 46 is provided.

In the imaging device according to the invention, the combination of the storage capacitor 30 and the thin film transistor 20 is formed while being divided for each pixel unit but the first organic photoelectric conversion layer 40 is formed as a continuous layer without being divided for each pixel unit.

Figure 4:
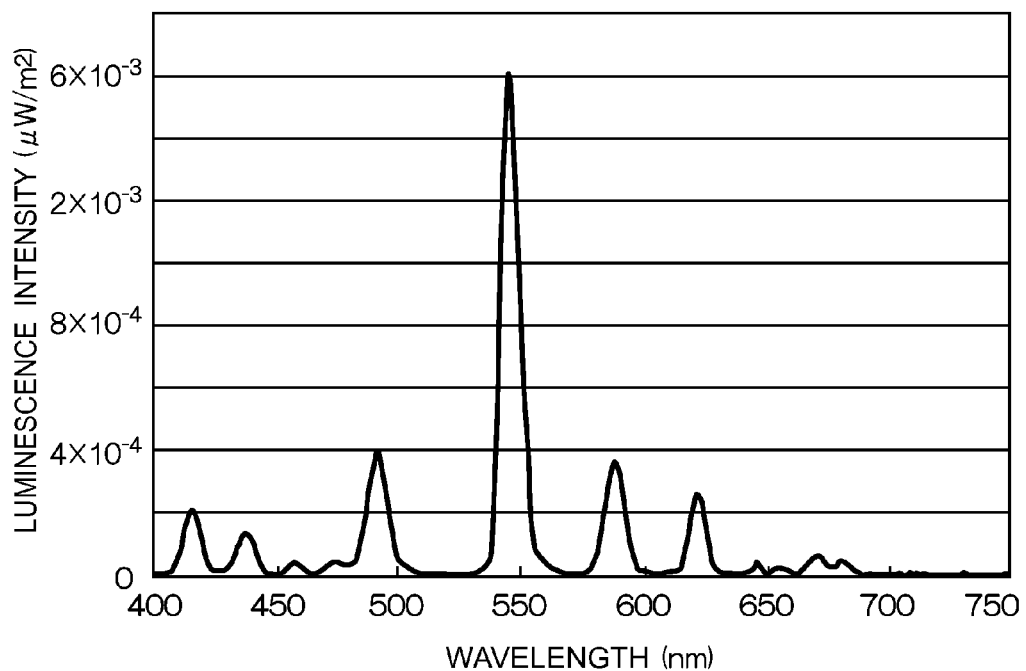
FIG. 4 is an X-ray luminescence spectrum of gadolinium oxysulfide.
Figure 5:
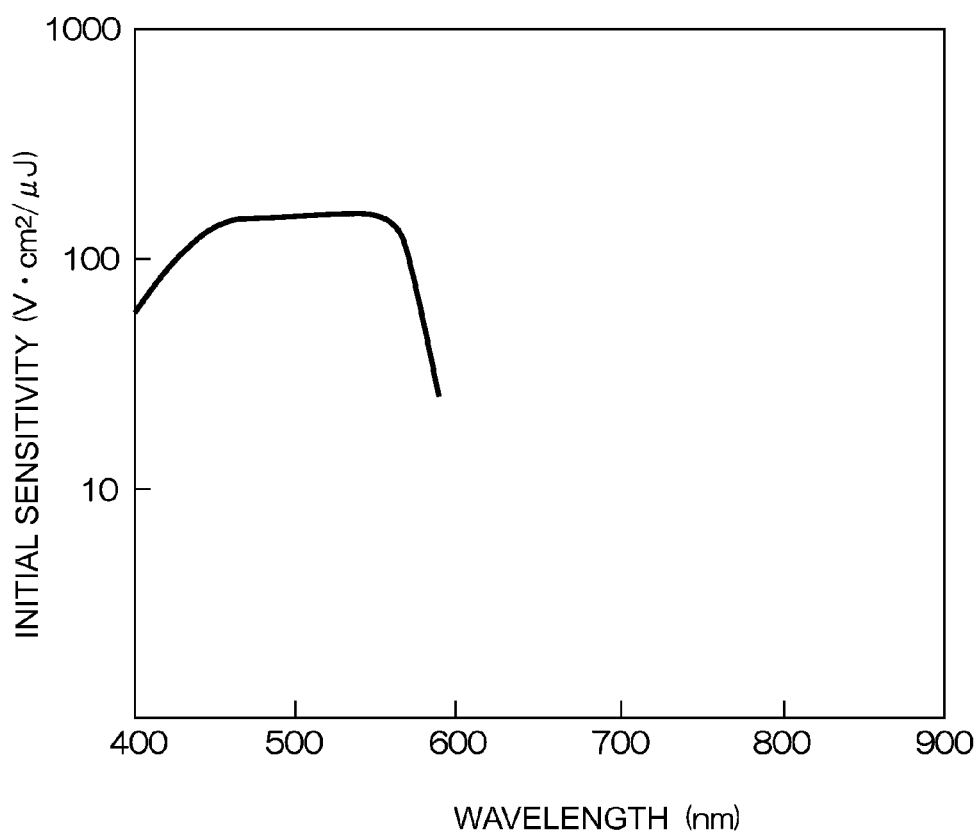
FIG. 5 is a spectral sensitivity curve of dibromo anthanthrone.

Among the lights converted in the scintilator layer 50, a first light containing the maximum peak wavelength is converted to a charge in the first organic photoelectric conversion layer 40. For example, when the scintilator layer 50 contains $Gd_2O_2S$:Tb (gadolinium oxysulfide, hereinafter, also referred to as "GOS") as a phosphor, light having the maximum peak wavelength of 550 nm is emitted by the emission of X-rays as illustrated in FIG. 4, and thus light in the range of 400 nm to 600 nm is set as the first light. For the charge generating layer 44 of the first organic photoelectric conversion layer 40, dibromo anthanthrone which absorbs the light in the range of 400 nm to 600 nm as illustrated in FIG. 5 and generates a charge is used.

The charge converted in the first organic photoelectric conversion layer 40 moves due to a voltage difference given between the bias electrode 46 and a storage capacitor lower electrode 32, and is stored in the storage capacitor 30 constituted by a storage capacitor upper electrode 36, the storage capacitor lower electrode 32, and a first interlayer insulating film 14 between the electrodes. The charge stored in the storage capacitor 30 is read by the thin film transistor 20. The thin film transistor 20 has a source electrode 24, a drain electrode 26 to be connected to the storage capacitor upper electrode 36, an active layer (channel layer) 28 between the source electrode 24 and the drain electrode 26, and a gate electrode 22 at the position facing the active layer 28 through the first interlayer insulating film 14. The thin film transistor 20 has a source electrode 24, a drain electrode 26 to be connected to the storage capacitor upper electrode 36, an active layer (channel layer) 28 between the source electrodes 24 and the drain electrode 26, and a gate electrode 22 at the position facing the active layer 28 through the first interlayer insulating film 14. Furthermore, an overcoat layer 82 formed with acrylic resin or the like is provided in such a manner as to cover the active layer (channel layer) 28 between the source electrode 24 and the drain electrode 26.

The thin film transistor 20 containing the active layer 28 is formed on the insulating substrate 10 by a lithography process or the like. When an amorphous oxide semiconductor, such as an oxide containing In, Ga, or Zn, is used as the active layer 28, film formation can be carried out by sputtering at a low temperature. Therefore, it becomes possible to use a plastic substrate which is hard to break even when an impact is given thereto as the insulating substrate 10.

In contrast, the amorphous oxide semiconductor has a property such that the threshold value of the thin film transistor 20 changes upon receiving light of 400 nm to 500 nm. However, when dibromo anthanthrone which absorbs light in the range of 400 nm to 600 nm is used for the charge generating layer 44 of the first organic photoelectric conversion layer 40 as described above, the light of 400 nm to 500 nm is absorbed by the first organic photoelectric conversion layer 40 and does not reach the active layer 28. Therefore, in this case, there is an advantage in that the fluctuation of the threshold value is suppressed even when an amorphous oxide semiconductor is used for the active layer 28.

When a charge is accumulated in the storage capacitor 30, a potential arises between the storage capacitor lower electrode 32 and the storage capacitor upper electrode 36 according to the accumulated amount. The storage capacitor upper electrode 36 and the drain electrode 26 are electrically connected. Thus, by turning the thin film transistor 20 into the ON state by an input signal of the gate electrode 22, the charges accumulated in the storage capacitor 30 are extract from the source electrode 24. By detecting the amount of the charges generating by an emitted electromagnetic wave for each pixel, and outputting the same as an electrical signal as described above, an image of the entire imaging target can be obtained.

Among the lights converted in the scintilator layer 50, a second light is converted to a charge in the second organic photoelectric conversion layer 60. The charge converted in the second organic photoelectric conversion layer 60 is read in the radiation dose detection circuit 70, and then output as an electrical signal. More specifically, the dose of radiation can be detected by the electrical signal, and thus when a radiation emitting device is controlled based on the detected dose of radiation, the dose of radiation to be emitted to the imaging target is controlled.

When dibromo anthanthrone is used for the charge generating layer 44 of the first organic photoelectric conversion layer 40, light in the range of 400 nm to 600 nm is absorbed. Thus, light having a wavelength longer than 600 nm may be selected as the second light.

As described above, the radiation dose detection circuit 70 is used for controlling the dose of radiation to be emitted to the imaging target. Thus, as the radiation dose detection circuit 70, a sensor having a resolution lower than that of the thin film transistor 20, for example, about 8×8 pixels, may be used. Therefore, an area sensor having a relatively simple structure can be used.

According to the radiographic imaging device of the invention, image data is obtained by the first light containing the maximum peak wavelength among the lights from the scintilator layer 50 and, in contrast, the dose of radiation to be emitted to the imaging target can be detected by the second light among the lights from the same scintilator layer 50.

Accordingly, the possession of image data and the control of the dose of radiation can be performed by the one scintilator layer 50, and thus a radiographic imaging device in which the dose of radiation is automatically controlled and which has a simple structure is obtained.

The possession of image data and the control of the dose of radiation are performed in the one scintilator layer 50. Thus, compared with the case where a scintilator layer for obtaining image data and a scintilator layer or a radiation sensitive layer for controlling the dose of radiation are separately used, differences in the properties do not arise between the former scintilator layer for obtaining image data and the latter scintilator layer or a radiation sensitive layer for controlling the dose of radiation. Therefore, the dose of radiation can be controlled with few errors.

According to the radiographic imaging device of the invention, the first light from the scintilator layer 50 is converted in the first organic photoelectric conversion layer 40. Since the first organic photoelectric conversion layer may be formed as a continuous layer, the structure can be made simple compared with the case where amorphous silicon requiring the formation in a pixel unit is used. Moreover, since the layer is an organic film, the photoelectric transfer characteristics hardly change due to deformation of a sensor panel, which is advantageous in the case of reducing the thickness of the radiographic imaging device and giving flexibility to the sensor form.

Furthermore, according to the radiographic imaging device of the invention, a sensor array having a relatively simple structure can be used as a reading sensor array as the radiation dose detection circuit 70, and thus it can be built in a light-weight and thin cassette. Even when the cassette is accidentally dropped and an impact is given to the radiographic imaging device, robust with which the functions are not hindered can be made to hold. In particular, when an amorphous oxide semiconductor, such as an oxide containing In, Ga, or Zn, is used as the active layer of the thin film transistor 20, a plastic substrate, such as PEN, can be used as the insulating substrate 10, and a radiographic imaging device that is even more robust is obtained.

In the radiographic imaging device according to the first exemplary embodiment of the invention, the second light from the scintilator layer 50 preferably has a wavelength different from the maximum peak wavelength of the first light in that a signal which automatically controls the dose of radiation can be easily and accurately extract. Furthermore, it is more preferable that the wavelength range of the second light from the scintilator layer 50 is longer than the maximum peak wavelength of the first light.

A preferable group of phosphors to be used for the scintilator layer 50 of the radiographic imaging device according to the first exemplary embodiment of the invention includes a phosphor in which light emitted by emission of radiation has (a) a spectrum containing two or more peaks having the maximum wavelengths that are different from each other and a narrow half width and (b) has one maximum wavelength and a wide wavelength range spectrum.

When X-rays are used as the radiation, preferable examples of the phosphor included in (a) above include gadolinium oxysulfide. In the gadolinium oxysulfide, the luminescence spectrum produced by X-ray irradiation has a sharp peak having the maximum peak wavelength at 550 nm and peaks each having the maximum wavelength around 420 nm, 440 nm, 490 nm, 580 nm, and 620 nm as illustrated in FIG. 4.

As a phosphor included in (b) above, a phosphor containing cesium iodide is preferable and cesium iodide to which thallium is added in which the luminescence spectrum produced by X-ray irradiation is in the range of 420 nm to 600 nm is particularly preferable.

In each layer disposed between the scintilator layer 50 and the second organic photoelectric conversion layer 60 of the radiographic imaging device according to the first exemplary embodiment of the invention, passing the second light from the scintilator layer 50 while suppressing a reduction in the light intensity to the greatest possible extent is preferable in that a signal which automatically controls the dose of radiation can be easily and accurately extracted. More specifically, lights having at least 20% intensity, more preferably at least 60% intensity, and most preferably at least 90% intensity of the maximum luminescence intensity of the second light are selected in such a manner as to reach the second organic photoelectric conversion layer.

In contrast, the first organic photoelectric conversion layer 40 absorbs the first light from the scintilator layer 50, and generates a charge. Accordingly, the layers constituting the first organic photoelectric conversion layer 40, particularly the charge generating layer 44, preferably absorb the first light and are transparent to the second light.

Examples of charge generating agents to be used for such a charge generating layer include anthanthrone and a halogen substituted derivative thereof, for example, dibromo anthanthrone. The dibromo anthanthrone absorbs light having a wavelength range of 400 nm to 600 nm but does not absorb light having a wavelength longer than 600 nm (i.e., transparent) as illustrated in FIG. 5.

When gadolinium oxysulfide or cesium iodide is used for the scintilator layer 50 and dibromo anthanthrone is used as the charge generating agent to be used for the charge generating layer 44, the first light from the scintilator layer 50 contains a maximum peak wavelength of 550 nm and the first light is absorbed by the charge generating layer 44, and is efficiently subjected to photoelectric conversion. In contrast, when light having a wavelength longer than 600 nm, such as light in the range of 620 nm to 700 nm, is selected as the second light from the scintilator layer 50, the second light passes without being absorbed by the charge generating layer 44 and reaches the second organic photoelectric conversion layer 60. Thus, the charge subjected to photoelectric conversion in the second organic photoelectric conversion layer 60 is read by the radiation dose detector circuit 70 for reading the same for each radiation dose detection pixel, and then the dose of radiation emitted to the imaging target can be detected with favorable sensitivity and accuracy. Accordingly, based on an electrical output read by the radiation dose detector circuit 70, i.e., the detected radiation dose, the dose of radiation to be emitted to the imaging target is can be accurately controlled.

<Second Exemplary Embodiment and Third Exemplary Embodiment>

In the radiographic imaging device according to the first exemplary embodiment of the invention, the second organic photoelectric conversion layer is disposed on the back surface of the insulating substrate 10. However, an exemplary embodiment in which the second organic photoelectric conversion layer 60 and the radiation dose detector circuit 70 are disposed between the plastic support 18 and the scintillator layer 50 (hereinafter, this exemplary embodiment is referred to as a "second exemplary embodiment") or an exemplary embodiment in which the second organic photoelectric conversion layer 60 and the radiation dose detector circuit 70 are disposed on the side of the plastic support 18 opposite to the side on which the scintillator layer 50 is disposed (hereinafter, this exemplary embodiment is referred to as a "third exemplary embodiment") may be acceptable.

Figure 2:
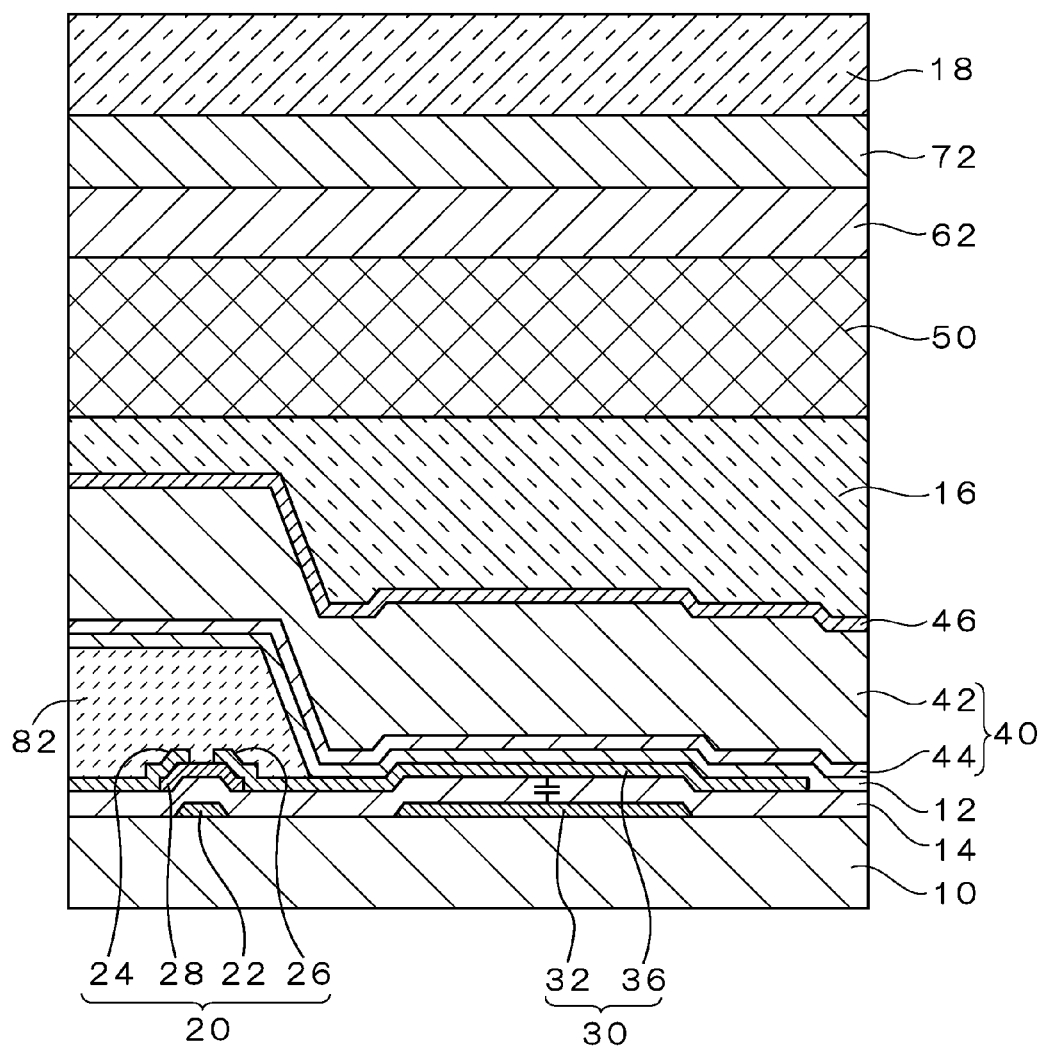
FIG. 2 is a cross sectional view illustrating an example of a configuration for one pixel according to a second exemplary embodiment of an imaging device according to the invention.
Figure 3:
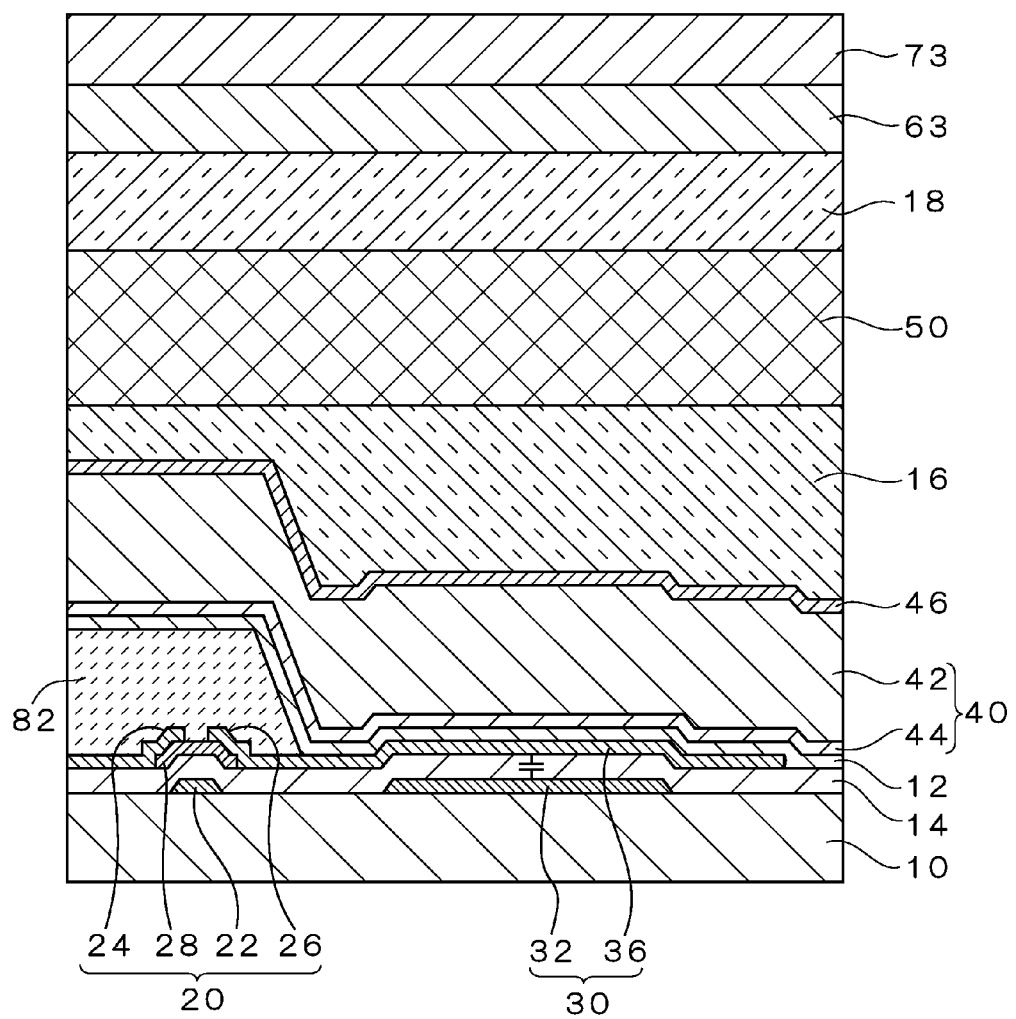
FIG. 3 is a cross sectional view illustrating an example of a configuration for one pixel according to a third exemplary embodiment of an imaging device according to the invention.

FIG. 2 is a cross sectional view schematically illustrating the configuration for one pixel of the radiographic imaging device according to the second exemplary embodiment. FIG. 3 is a cross sectional view schematically illustrating the configuration for one pixel of the radiographic imaging device according to the third exemplary embodiment. In FIGS. 2 and 3, the components designated by the same reference numerals are the same as those of FIG. 1. In the second exemplary embodiment of FIG. 2, a second organic photoelectric conversion layer 62 and a radiation dose detector circuit 72 are disposed between the plastic support 18 and the scintillator layer 50. In the third exemplary embodiment of FIG. 3, a second organic photoelectric conversion layer 63 and a radiation dose detector circuit 73 are disposed at the side of the plastic support 18 opposite to the side on which the scintillator layer 50 is disposed.

The second exemplary embodiment and the third exemplary embodiment are different from the first exemplary embodiment in that the second light from the scintillator layer 50 directly reaches the second organic photoelectric conversion layers 62 and 63 without passing through the first organic photoelectric conversion layer 40. Accordingly, in the second exemplary embodiment and the third exemplary embodiment, the first organic photoelectric conversion layer 40 may be one also absorbing the second light. In this respect, the first organic photoelectric conversion layer 40, particularly the charge generating agent to be used for the charge generating layer 44, is selected from a wide range compared with the first exemplary embodiment. The second organic photoelectric conversion layers 62 and 63 may be one performing photoelectric conversion of light having the same wavelength as that of the first light. In this case, the radiation dose detection sensitivity increases. By producing the first organic photoelectric conversion layer 40 and the second organic photoelectric conversion layers 62 and 63 to have the same configuration and producing the layers in a common process, the cost can be reduced.

Hereinafter, the imaging device according to this exemplary embodiment will be described in further detail with a method for producing the same. The materials, the film forming method, and the film thickness of each component described below are examples, and may be selected as appropriate according to the purpose of the imaging device, the type of an electromagnetic wave as a detection target, or the like.

<Insulating Substrate>

As the insulating substrate 10, substrates having strength with which constituents (imaging elements) other than the substrate can be support are used. Examples include a glass substrate, a silicon substrate having an insulating layer, plastic substrates, such as polyethyleneterephthalate (PET), polyethylenenaphthalate (PEN), all aromatic polyamides, and polyimides, and a metal substrate having an insulating layer. Among the above, when the plastic substrate is used, an imaging device which is light-weight and maintains the robust with which the functions are not hindered even when an impact caused by dropping or the like is given is obtained. In order to suppress the penetration of oxygen and moisture, a barrier layer, such as an SiON film (not illustrated), is preferably formed on the entire surface of one side on which the imaging element is formed. The SiON film can be formed by a CVD method, and the thickness is 500 nm, for example.

<Storage Capacitor Lower Electrode and Gate Electrode>

On the insulating substrate 10, the storage capacitor lower electrode 32 and the gate electrode 22 are formed. For example, molybdenum (Mo) is formed into a film having a thickness of 40 nm by sputtering on a glass substrate as the insulating substrate 10, and then the Mo film is patterned by photolithography at the position and the shape according to each of the electrodes 32 and 22.

Preferable examples of materials to be used as the gate electrode include metals, such as Al, Mo, Cr, Ta, Ti, Au, or Ag, alloys, such as Al—Nd or APC, metal oxide conductive films, such as tin oxide, zinc oxide, indium oxide, indium tin oxide (ITO), or indium zinc oxide (IZO), organic conductive compounds, such as polyaniline, polythiophene, or polypyrrole, or mixtures thereof.

The thickness of the gate electrode 22 is 10 nm to 1000 nm, for example.

<First Interlayer Insulating Film>

Next, the first interlayer insulating film (gate insulating film) 14 is formed on the gate electrode 22 and the storage capacitor lower electrode 32. The first interlayer insulating film 14 is obtained by sputtering silicon dioxide into a film having a thickness of 200 nm, for example.

The first interlayer insulating film 14 may be formed by coating acrylic resin, novolac resin, or polyimide resin with a thickness of about 500 nm by known methods, such as spin coating, spray coating, or screen printing. In this case, an $SiO_2$ film is preferably further formed with a thickness of 20 nm on the resin film by sputtering, a CVD method, or the like.

<Active layer>

Subsequently, the active layer (channel layer) 28 is formed. The active layer 28 is formed with an In—Ga—Zn—O-based oxide semiconductor and preferably an amorphous oxide semiconductor, for example. Since the amorphous oxide semiconductor can be formed into a film by sputtering at a low temperature, there is an advantage in that a plastic substrate can be used as the insulating substrate 10. As the In—Ga—Zn—O-based oxide semiconductor, oxides containing at least one of In, Ga, and Zn (for example, In—O base) are preferable, oxides containing at least two of In, Ga, and Zn (for example, In—Zn—O base, In—Ga base, Ga—Zn—O base) are more preferable, and oxides containing In, Ga, and Zn are particularly preferable. As the In—Ga—Zn—O-based amorphous oxide, amorphous oxides in which the composition in a crystalline state is represented by $InGaO_3(ZnO)_m$ (m is a natural number lower than 6) are preferable, and particularly $InGaZnO_4$ is more preferable.

An active layer containing the In—Ga—Zn—O-based amorphous oxide semiconductor described above can be formed by sputtering at a low temperature. According to each active layer 28 to be formed, the In—Ga—Zn—O-based amorphous oxide semiconductor film is patterned by photolithography. The thickness of the active layer 28 is 10 nm, for example.

<Source-Drain Electrode and Upper Electrode of Capacitor>

Next, the source electrode 24 and the drain electrode 26 of the thin film transistor (hereinafter also referred to as a "TFT") 20 and the storage capacitor upper electrode 36 of the storage capacitor (hereinafter also referred to as a "capacitor") 30 are formed.

For example, an IZO ($In_2O_3$—ZnO) film is formed by photolithography at the position and the shape according to the source electrode 24 and the drain electrode 26 of the TFT 20 and the upper electrode 36 of the capacitor 30. In this case, patterning is performed so that the drain electrode 26 of TFT 20 and the upper electrode 36 of the capacitor 30 are electrically connected to each other. The thickness of each of the electrodes 24, 26, and 36 is 200 nm, for example.

On the source electrode 24 and the drain electrode 26, a gallium oxide film (not illustrated) is preferably formed in such a manner as to cover the two electrodes and the active layer of a gap region between the two electrodes. Thus, an advantage of protecting the active layer from the influence of moisture in the atmosphere is obtained.

Furthermore, an overcoat layer 82 of acrylic resin, for example, is formed by application by spin coating, mask exposure, development, and firing in such a manner as to cover the source electrode 24, the drain electrode 26, the active layer 28, and the gallium oxide film (not illustrated).

The active layer 28 may be formed on the source-drain electrodes 24 and 26. More specifically, the source-drain electrodes 24 and 26 are formed, and then the active layer 28 may be formed.

<First Organic Photoelectric Conversion Layer>

The source electrode 24, the drain electrode 26, the upper electrode 36 of the capacitor, and the active layer 28 are formed, and then the first organic photoelectric conversion layer 40 is formed thereon. However, the undercoat layer 12 is preferably formed before the formation.

<Undercoat Layer>

The undercoat layer 12 has functions of preventing charge injection from the storage capacitor upper electrode and increasing the adhesiveness between the electrode and the charge generating layer so as not to change the photoelectric transfer characteristics even when a sensor panel deforms. The undercoat layer 12 is obtained by applying an alcohol solution of alcohol soluble polyamide resin, for example, by spin coating or the like, and then evaporating and drying the alcohol so that the thickness is set to 0.1 µm.

<Charge Generating Layer>

As a coating liquid for forming the charge generating layer 44 on the undercoat layer 12, a liquid in which a dibromo anthanthrone pigment as a charge generating agent is dispersed in a cyclohexanone solution of polyvinyl butyral resin as a binder is prepared. Then, the liquid is spin coated, baked to evaporate the cyclohexanone, and dried, thereby forming the charge generating layer 44 having a thickness of 0.1 µm.

As the charge generating agent to be used for the radiographic imaging device according to the first exemplary embodiment of the invention, anthanthrone, such as a dibromo anthanthrone pigment, is the most preferable, and, in addition thereto, quinacridone is also mentioned as a preferable example.

Examples of the charge generating agent to be used for the radiographic imaging devices according to the second exemplary embodiment and the third exemplary embodiment of the invention include phthalocyanine other than anthanthrone and quinacridone.

<Charge Transport Layer>

As a coating liquid for forming the charge transport layer 42, a liquid in which 5 g of N,N'-diphenyl-N,N'-bis(3-methylphenyl)-4,4'-diaminobiphenyl as a charge transport agent and 5 g of polycarbonate as a binder (Weight average molecular weight of 35,000 to 40,000) are dissolved in 35 g of methylenechloride is prepared. Then, the liquid is dip coated on the charge generating layer 44, and dried at 100° C. for 1 hour to form the charge transport layer 42 having a film thickness of 2 µm.

As the charge transport agent, known polyvinyl carbazole can be used in addition to the above.

<Bias Electrode>

A bias electrode 46 is formed on the charge transport layer 42. The bias electrode 46 is formed by sputtering IZO into a film having a thickness of 40 nm, for example.

A member containing the TFT 20, the storage capacitor 30, the first organic photoelectric conversion layer 40, and the bias electrode 46 on the insulating substrate 10 produced as described above is referred to as a member 1.

<Plastic Support>

Forming the scintilator layer 50 on the plastic support 18 is advantageous in manufacturing. Examples of the plastic support 18 include substrates obtained by forming plastics, such as polyethyleneterephthalate (PET), polyethylenenaphthalate (PEN), all aromatic polyamides, or polyimides, into a film shape. For example, PET having a thickness of 200 µm is used.

<Scintilator Layer>

The scintilator layer 50 is formed by preparing a coating liquid in which a phosphor is dispersed in a binder solution, applying the coating liquid onto the plastic support 18 by doctor blade coating or the like, and drying.

As the phosphor, gadolinium oxysulfide is the most preferable. The gadolinium oxysulfide includes one containing terbium or the like. In addition, cesium iodides, such as cesium iodide to which titanium is added or cesium iodide to which tantalum is added, are also preferable.

As the binder, polyvinyl butyral or the like can be used.

The thickness of the scintilator layer 50 is selected from the range of 50 µm to 600 µm.

Thus, a member in which the scintilator layer 50 is formed on the plastic support 18 is referred to as a member 2.

The member 1 and the member 2 are bonded to each other through the second interlayer insulating film 16 so that the bias electrode 46 of the former and the scintilator layer 50 of the latter face each other. Then, the second organic photoelectric conversion layer 60 and the radiation dose detector circuit 70 are formed on the back surface of the insulating substrate of the member 1, whereby the radiographic imaging device according to the first exemplary embodiment of the invention is obtained.

In the case of the radiographic imaging device according to the second exemplary embodiment of the invention, the second organic photoelectric conversion layer 62 and the radiation dose detector circuit 72 are formed between the plastic support 18 and the scintilator layer 50. Then, the above is used instead of the member 2 and is bonded to the member 1 through the second interlayer insulating film 16 so that the scintilator layer 50 of the former faces the bias electrode 46 of the latter, whereby the radiographic imaging device according to the second exemplary embodiment of the invention is obtained.

In the case of the radiographic imaging device according to the third exemplary embodiment of the invention, the second organic photoelectric conversion layer 63 and the radiation dose detector circuit 73 are formed on the surface of the plastic support 18 opposite to the side on which the scintilator layer 50 is provided (hereinafter also referred to as a "back surface"). In this case, the second organic photoelectric conversion layer 63 and the radiation dose detector circuit 73 may be formed before the formation of the scintilator layer 50 on the plastic support 18. Then, the above is used instead of the member 2 and is bonded to the member 1 through the second interlayer insulating film 16 so that the scintilator layer 50 of the former faces the bias electrode 46 of the latter, whereby the radiographic imaging device according to the third exemplary embodiment of the invention is obtained.

In any exemplary embodiment of the second exemplary embodiment and the third exemplary embodiment of the invention, on the plastic support 18, the second organic photoelectric conversion layer 62 and the radiation dose detector circuit 72 may be formed in this order or the second organic photoelectric conversion layer 63 and the radiation dose detector circuit 73 may be formed in this order or vice versa.

The second organic photoelectric conversion layer 60 can be formed in the same manner as in the first organic photoelectric conversion layer 40. More specifically, an undercoating layer on a lower electrode, a charge generating layer, a charge transport layer, and an upper electrode are provided and the sensitivity wavelength range of the charge generating layer is made the same as the wavelength band of the second light. As the charge generating layer applied to a first example, benzimidazole perylene (BZP) can be used. As the charge generating layer applied to second and third examples, the same dibromo anthanthrone as that of the first organic photoelectric conversion layer 40 or hexagonal selenium can be used.

One of the upper and lower electrodes is divided into areas, a current amplifier is connected to each area electrode, and then the dose of X-rays incident in each area is detected to be used for controlling the exposure time of the X-rays.

When one of the upper and lower electrodes is divided into areas, a resistive element is inserted between one electrode divided into areas and the earth electrode, a bias voltage is applied between a common electrode which is not divided and the earth electrode, and a voltage between both ends of the resistive element is integrated during the X-ray irradiation, the radiation dose detector circuit 70 can detect the dose of X-rays incident in each area.

Examples of materials of the second interlayer insulating film 16 include acrylic resin, novolac resin, and polyimide resin.

A radiographic imaging system using the radiographic imaging device of the invention contains a radiation emitting device, the radiographic imaging device described above, and a control device for controlling the radiation emitting device.

The radiation emitting device contains an X-ray tube and a power supply for exciting the X-ray tube, for example. The radiation from the radiation emitting device passes through an imaging target, and enters the radiographic imaging device. Radiation dose detection signals for each area relating to the radiation dose detected in the radiation dose detector circuits 70, 72, and 73 of the radiographic imaging device generate. One of the signals for each area is selected, and input into the control device for controlling the radiation emitting device.

The signal input into the control device is judged by an internal comparing measure whether a required dose is emitted. When it is judged that the dose of X-rays reaches the required dose, a signal for terminating the exposure is transmitted to an X-ray control signal to terminate the exposure of X-rays. After the termination of the exposure of X-rays, a plane imaging device performs a reading operation. By the reading operation, signals carrying the information on a human body accumulated in the capacitor of each pixel are read, and images are obtained.

In the above, the invention is described but is not limited to the exemplary embodiment described above. For example, a glass substrate may be used as the insulating substrate 10 and the active layer 22 of the thin film transistor 20 may be formed with amorphous silicon.

The invention includes the following exemplary embodiments.

<1> A radiographic imaging device, comprising:
a scintilator layer which converts, to light, transmitted radiation that is incident with emission of the radiation to an imaging target;
a first organic photoelectric conversion layer which is continuous and converts a first light containing a maximum peak wavelength from the scintilator layer to a charge;
an insulating substrate having a storage capacitor and a thin film transistor for reading the charge generated in the first organic photoelectric conversion layer for each of a plurality of image detection pixels;
a second organic photoelectric conversion layer which converts a second light from the scintilator layer to a charge; and
a radiation dose detection circuit for reading the charge generated in the second organic photoelectric conversion layer for each of a plurality of radiation dose detection pixels.

<2> The radiographic imaging system according to <1>, wherein the second light has a wavelength range that does not include the maximum peak wavelength of the first light.

<3> The radiographic imaging device according to <2>, wherein each wavelength in the wavelength range of the second light is longer than the maximum peak wavelength of the first light.

<4> The radiographic imaging device according to any one of <1> to <3>, wherein the second light is light emitted to a different side from the first light relative to the scintilator layer.

<5> The radiographic imaging device according to any one of <1> to <4>, wherein the second organic photoelectric conversion layer is a continuous layer.

<6> The radiographic imaging device according to any one of <1>1 to <5>, comprising the scintilator layer, the first organic photoelectric conversion layer, and the insulating substrate having the storage capacitor and the thin film transistor in this order.

<7> The radiographic imaging device according to <6>, comprising the second organic photoelectric conversion layer at a side of the insulating substrate opposite to the first organic photoelectric conversion layer.

<8> The radiographic imaging device according to <6>, comprising the second organic photoelectric conversion layer at a side of the scintilator layer opposite to the first organic photoelectric conversion layer.

<9> The radiographic imaging device according to <1>, wherein the first organic photoelectric conversion layer comprises a charge generating layer and a charge transport layer.

<10> The radiographic imaging device according to <9>, wherein the charge generating layer comprises anthanthrone.

<11>. The radiographic imaging device according to any one of <1> to <10>, wherein the scintilator layer comprises cesium iodide or gadolinium oxysulfide.

<12> The radiographic imaging device according to any one of <1> to <11>, wherein the thin film transistor comprises an active layer formed with an amorphous oxide semiconductor.

<13> The radiographic imaging device according to <12>, wherein the amorphous oxide semiconductor comprises at least one of In, Ga, or Zn.

What is claimed is:

1. A radiographic imaging device, comprising:
a scintilator layer which converts, to light, transmitted radiation that is incident with emission of the radiation to an imaging target;
a first organic photoelectric conversion layer which is continuous and not divided for each pixel unit, and converts a first light containing a maximum peak wavelength from the scintilator layer to a charge;
an insulating substrate having a storage capacitor and a thin film transistor for reading the charge generated in the first organic photoelectric conversion layer for each of a plurality of image detection pixels;
a second organic photoelectric conversion layer which converts a second light from the scintilator layer to a charge; and
a radiation dose detection circuit for reading the charge generated in the second organic photoelectric conversion layer for each of a plurality of radiation dose detection pixels.

2. The radiographic imaging system according to claim 1, wherein the second light has a wavelength range that does not include the maximum peak wavelength of the first light.

3. The radiographic imaging device according to claim 2, wherein each wavelength in the wavelength range of the second light is longer than the maximum peak wavelength of the first light.

4. The radiographic imaging device according to claim 1, wherein the second light is light emitted to a different side from the first light relative to the scintilator layer.

5. The radiographic imaging device according to claim 1, wherein the second organic photoelectric conversion layer is a continuous layer.

6. The radiographic imaging device according to claim 1, comprising the scintilator layer, the first organic photoelectric conversion layer, and the insulating substrate having the storage capacitor and the thin film transistor in this order.

7. The radiographic imaging device according to claim 6, comprising the second organic photoelectric conversion layer at a side of the insulating substrate opposite to the first organic photoelectric conversion layer.

8. The radiographic imaging device according to claim 6, comprising the second organic photoelectric conversion layer at a side of the scintilator layer opposite to the first organic photoelectric conversion layer.

9. The radiographic imaging device according to claim 1, wherein the first organic photoelectric conversion layer comprises a charge generating layer and a charge transport layer.

10. The radiographic imaging device according to claim 9, wherein the charge generating layer comprises anthanthrone.

11. The radiographic imaging device according to claim 1, wherein the scintilator layer comprises cesium iodide or gadolinium oxysulfide.

12. The radiographic imaging device according to claim 1, wherein the thin film transistor comprises an active layer formed with an amorphous oxide semiconductor.

13. The radiographic imaging device according to claim 12, wherein the amorphous oxide semiconductor comprises at least one of In, Ga, or Zn.

14. A radiographic imaging system, comprising:
a radiation emitting device;
the radiographic imaging device according to claim 1; and
a control device which controls the radiation emitting device based on a dose of radiation detected in a radiation dose detection circuit of the radiographic imaging device.

* * * * *